US006362111B1

United States Patent
Laaksonen et al.

(10) Patent No.: US 6,362,111 B1
(45) Date of Patent: Mar. 26, 2002

(54) TUNABLE GATE LINEWIDTH REDUCTION PROCESS

(75) Inventors: Reima Laaksonen, Dallas; Robert Kraft, Plano; James B. Friedmann, Dallas, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/382,519

(22) Filed: Aug. 25, 1999

Related U.S. Application Data

(60) Provisional application No. 60/111,465, filed on Dec. 9, 1998.

(51) Int. Cl.$^7$ ............................................. H01L 21/302
(52) U.S. Cl. ..................... 438/725; 430/5; 438/622; 438/734; 438/736; 438/739; 438/717; 438/719
(58) Field of Search ......................... 430/5; 438/622, 438/734, 736, 739, 717, 719, 725

(56) References Cited

U.S. PATENT DOCUMENTS

| | | | |
|---|---|---|---|
| 5,804,088 A | * 9/1998 | McKee | 216/47 |
| 5,963,841 A | * 10/1999 | Karlsson et al. | 438/952 |
| 5,965,461 A | * 10/1999 | Yang et al. | 438/717 |
| 5,976,769 A | * 11/1999 | Chapman | 430/316 |
| 6,010,829 A | * 1/2000 | Rogers et al. | 430/316 |
| 6,037,266 A | * 3/2000 | Tao et al. | 438/719 |

FOREIGN PATENT DOCUMENTS

| | | | |
|---|---|---|---|
| EP | 753763 | * | 1/1997 |
| EP | 753885 | * | 1/1997 |

* cited by examiner

Primary Examiner—George Goudreau
(74) Attorney, Agent, or Firm—Jaqueline J. Garner; W. James Brady, III; Frederick J. Telecky, Jr.

(57) ABSTRACT

A process for forming a polysilicon line having linewidths below 0.23 $\mu$m. The layer of polysilicon (20) is deposited over a semiconductor body (10). A layer of bottom anti-reflective coating (BARC) (30) is deposited over the polysilicon layer (20). A resist pattern (40) is formed over the BARC layer (30) using conventional lithography (e.g., deep UV lithography). The BARC layer (30) is etched with an etch chemistry of $HBr/O_2$ using the resist pattern (40) until the endpoint is detected. The BARC layer (30) and resist pattern (40) are then overetched using the same etch chemistry having a selectivity of approximately one-to-one between the BARC and resist. The overetch is a timed etch to control the linewidth reduction in the resist/BARC pattern. The minimum dimension of the pattern (50) is reduced to below the practical resolution limit of the lithography tool. Finally, the polysilicon layer (20) is etched using the reduced width pattern (50).

14 Claims, 2 Drawing Sheets

TUNABLE GATE LINEWIDTH REDUCTION PROCESS

This application claims priority under 35 USC §119(e)(1) of provisional application number 60/111,465 filed Oct. 9, 1998 now expired.

FIELD OF THE INVENTION

This invention generally relates to transistor formation and more specifically to a process for forming polysilicon gate/lines having a narrow width.

BACKGROUND OF THE INVENTION

As CMOS technology pushes deeper into the submicron region, it becomes more difficult to lithographically pattern the smaller linewidths needed. Some of the most prominent critical issues are cost, performance, and manufacturing worthiness of the lithography tool needed for patterning of device dimensions less than 0.15 µm with tight critical dimension (CD) control. I-line lithography has been reliably used in 0.50 µm and 0.35 µm CMOS production.

An alternative approach to achieving deep-submicron linewidths lithographically is resist ashing. In this approach, after a resist pattern is formed lithographically, the resist is eroded to achieve a reduction in linewidth. Resist ashing techniques have been reported to produce 0.1–0.2 µm polysilicon gate length MOS devices using conventional g-line lithography. However, this technique can not meet the stringent CD control requirements, across the wafer (e.g., <0.025 µm) and from wafer-to-wafer (e.g., 3-Sigma=0.025 µm), needed for sub-0.25 µm processing.

Another prior art approach uses a fluorine-based etch chemistry for pattern linewidth reduction. In this approach, a BARC (bottom anti-reflective coating) layer is formed over the polysilicon prior to resist coating. A pattern is formed of the resist using conventional lithography. A fluorine-based etch is then used to etch the BARC. The etch is continued past endpoint into an overetch which has a horizontal etch component that reduces the width of the remaining BARC and resist pattern. This creates a pattern having a width less than the minimum lithography tool capability. After the overetch, the wafer is transferred to a separate chamber and the reduced-width pattern is then used for the polysilicon etch. However, this approach has disadvantages, since the fluorine-based BARC etch chemistry can remove a significant amount of the polysilicon layer during the BARC overetch, making the subsequent polysilicon etch more difficult.

SUMMARY OF THE INVENTION

A process for forming a polysilicon line having linewidths below the lithography tool limits is disclosed herein. The layer of polysilicon is deposited over a semiconductor body. A layer of bottom anti-reflective coating (BARC) is deposited over the polysilicon layer. A resist pattern is formed over the BARC layer using conventional lithography (e.g., deep UV or I-line lithography). The resist pattern has minimum dimensions of the lithography tool limits or greater. The BARC layer is etched with a chemistry comprising HBr and $O_2$ until the endpoint is detected. The etch is continued past endpoint into an overetch portion where the etch has a horizontal component that reduces the width of both the resist and BARC layers. The minimum dimension of the pattern is reduced to below the lithography tool limits. Finally, the polysilicon layer is etched using the reduced width pattern.

An advantage of the invention is providing a process for controllably forming polysilicon lines having a minimum dimension less than the practical resolution limits of the lithography tool (e.g., less than 0.18 µm for deep UV lithography).

This and other advantages will be apparent to those of ordinary skill in the art having reference to the specification in conjunction with the drawings.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

The invention will now be described in conjunction with deep UV lithography used in forming polysilicon gates in a CMOS process. However, it will be apparent to those of ordinary skill in the art that the invention is also applicable to other lithography types (e.g., I-line), other polysilicon lines, and other processes.

Figure 1:
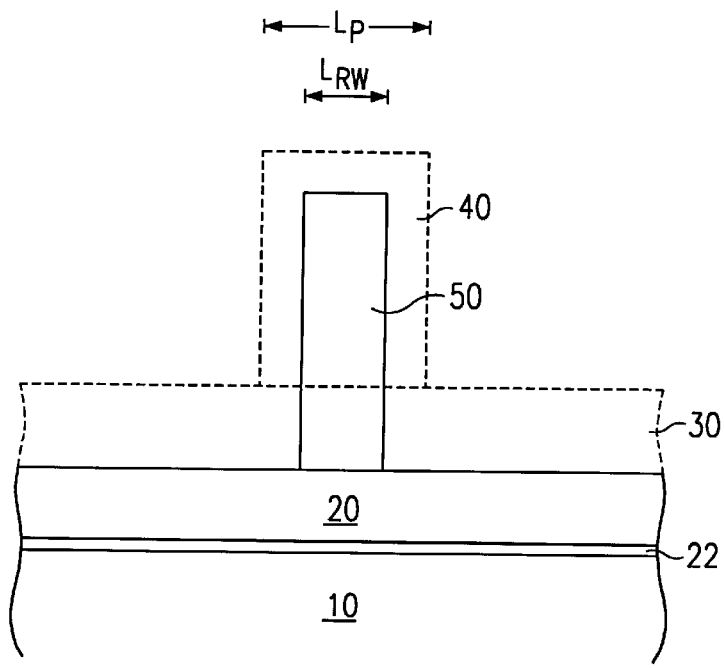
FIG. 1 is a cross-sectional diagram of a semiconductor body before and after the line width reduction according to the invention.

FIG. 1 illustrates a cross-section of a semiconductor body before and after the pattern width reduction according to the invention. The dashed lines indicate the cross-section before the linewidth reduction and the solid lines indicate the cross-section after the linewidth reduction. A resist pattern 40 having a minimum dimension, Lp, is formed on the BARC layer 30. The minimum dimension, Lp, is determined by the lithography limits of the lithography tool being used. A $HBr/O_2$-based BARC linewidth reduction etch is then used. It consists of an endpointed etch followed by a timed overetch. The overetch time is calculated to achieve the desired reduction in linewidth. The overetch has a selectivity between resist and BARC of approximately one-to-one. This causes a reduction in the width of pattern 40 and creates reduced width pattern 50. Reduced width pattern 50 has a minimum dimension, Lrw, less than Lp. Lrw is the desired width of the polysilicon line and may, for example, be 0.11 µm. Thus, polysilicon linewidths less than the limits of the lithography tool being used can reliably be achieved using this process.

Figure 2:
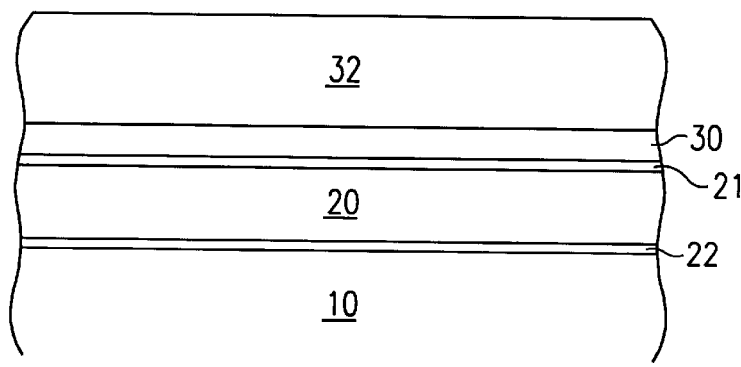
FIGS. 2–6 are a cross-sectional diagrams of a semiconductor body undergoing the process according to the invention at various stages in the process.

A more detailed explanation of the process will now be given. Referring to FIG. 2, a gate dielectric 22, such as silicon-dioxide, is deposited on a semiconductor body 10. A polysilicon layer 20 is deposited on gate dielectric 22. However, the invention is not limited to polysilicon gates and may be used for other gate structures (e.g., metal, poly-metal, poly-silicide, etc.) or patterned features in general. As the wafer is transferred between processes, a native oxide layer 21 typically forms on the surface of polysilicon layer 20.

A BARC layer 30 is deposited over polysilicon layer 20 (including over native oxide layer 21). Example BARC materials, including both organic and inorganic BARCs, will be apparent to those of ordinary skill in the art. A layer of photoresist 32 is then deposited over BARC layer 30. Various resist materials may be used to practice the invention. For example, positive tone I-line resists may be used.

The total height of the BARC and resist layers is optimized for lithographic purposes, for example, to minimize the standing wave effects and to ensure the pattern subsequently formed will survive the polysilicon layer 20 etch. For example, a BARC layer 30 thickness in the range of 1200–1600 Å and a resist layer 32 thickness on the order of 7700 Å may be used to achieve a 0.1 $\mu$m line width reduction. Thicker resists may allow for further line width reductions. It should be noted that this is an example only and that many other thickness variations are possible depending on the above described optimizations and on the type of resist and BARC used.

If desired, an optional top anti-reflective coating (TARC) may also be used. If used, the TARC material would have the same etch properties as the resist (i.e., 1:1 selectivity). TARCs can be advantageous for lithography purposes such as improving the critical dimension control across a wafer between densely spaced lines and less densely spaced lines. No TARC layer is used in the present embodiment.

Figure 3:
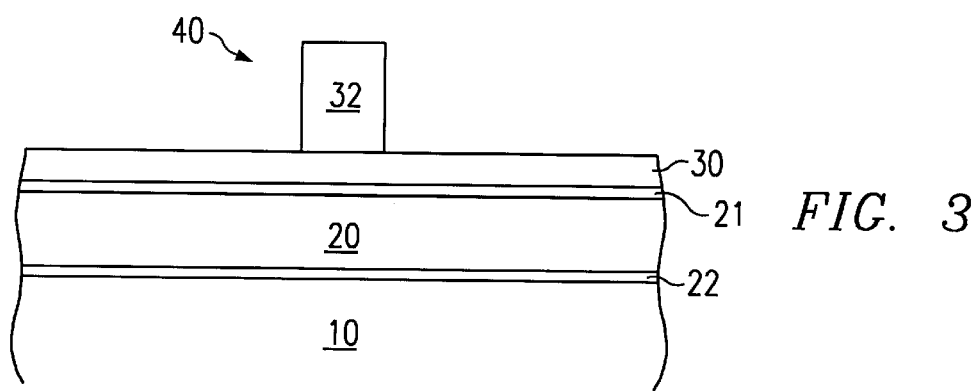

Referring to FIG. 3, a pattern 40 is created from the resist layer 32. Pattern 40 is created using standard photolithography techniques, such as deep UV lithography. Pattern 40 has a minimum dimension, Lp, determined by the limits of the lithography tool. However, the Lp used may be greater than the lithographic limits.

Figure 4:
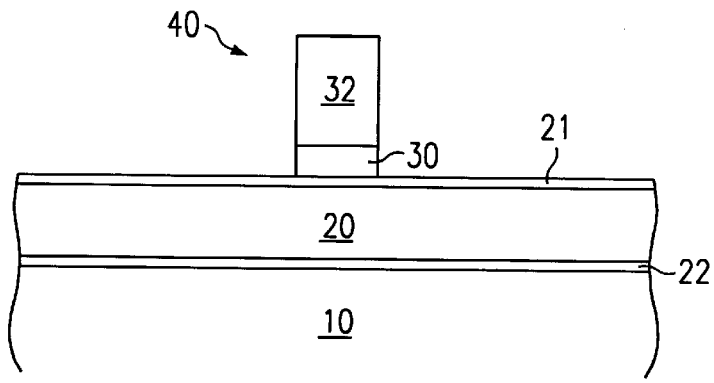
Figure 5:
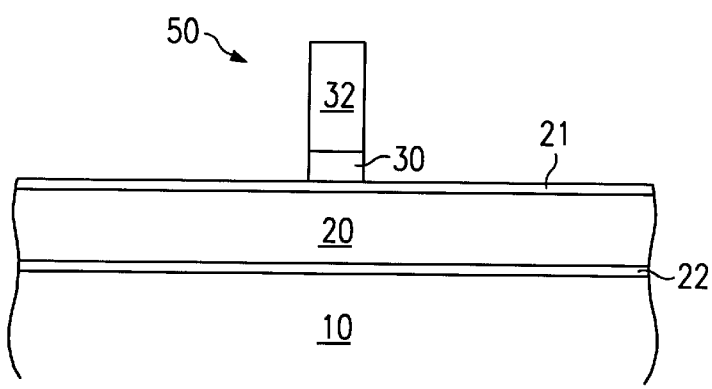

The BARC layer 30 is then etched. A low pressure, high density etch chamber may be used. First, a $HBr/O_2$ etch to endpoint is performed as shown in FIG. 4. This etch has a mainly vertical component. Then, the etch is continued into an overetch portion using the same process conditions. As the BARC clears from the surface, a horizontal component of the etch emerges (in addition to the vertical component) and reduces the lateral dimension of both the resist and BARC. A timed overetch (by time or as a percentage of the main etch time) is used to achieve the desired reduction in linewidth creating reduced width pattern 50, as shown in FIG. 5. The selectivity of the etch between resist and BARC is approximately one-to-one. The maximum linewidth reduction is limited at the point where there is not enough resist left to survive the subsequent polysilicon etch.

The $HBr/O_2$ etch is very selective to both polysilicon and oxide. Thus, thin native oxide 21 that normally forms over the polysilicon layer 20 protects the polysilicon. Furthermore, the polysilicon etch rate is also very low relative to the BARC etch rate. Thus, polysilicon removal is not a concern as it is in the prior art fluorine/oxygen etch. (Fluorine etches both oxide and polysilicon.)

The overetch portion of the BARC etch is preferably 50–70% of the endpoint etch time. This allows sufficient time to clear all the BARC in the presence of topography (as typical overetches do) and also achieve the desired resist linewidth reduction. The $HBr/O_2$ etch is very controllable, since the lateral reduction rate is linear as a function of etch time. Because of this, lithography and etch process variations are easily compensated for.

Figure 6:
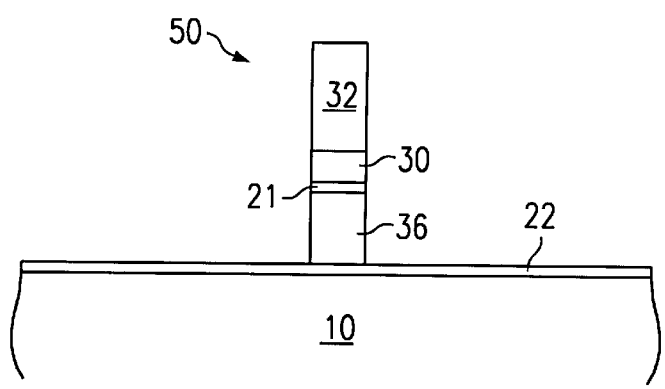

Next, the polysilicon layer 20 is etched using the reduced width pattern 50. An advantage of the invention is that the polysilicon layer 20 may be etched in the same chamber used for the BARC etch/overetch. A breakthrough etch is performed first using a $CF_4$ chemistry. This is followed by a $HBr/Cl_2/He:O_2$ etch to endpoint and a $HBr:He:O_2$ overetch to clear any remaining polysilicon and remove any filaments. The resultant polysilicon line 36 is shown in FIG. 6. It should be noted that other suitable polysilicon etch processes will be apparent to those of ordinary skill in the art. However, the advantage of this etch is that the etch chemistries used for the BARC etch and those for the polysilicon etch do not interfere with each other. Accordingly, both processes may be performed in the same chamber The polysilicon etch itself does not significantly contribute to linewidth reduction. Overall linewidth reduction is controlled by the BARC etch. The entire BARC/Poly etch sequence may be done in sequence without breaking vacuum. This allows for reduced cycle time and a cleaner process.

The following is an exemplary BARC/Poly etch process according to the invention.

| A. BARC MAIN ETCH | | | B. BARC OVERETCH | | |
|---|---|---|---|---|---|
| Poly Chamber | | | Poly Chamber | | |
| Gases: | HBr | 87 cc | Gases: | HBr | 87 cc |
|  | $O_2$ | 32 cc |  | $O_2$ | 32 cc |
| Pressure |  | 8 mTorr | Pressure |  | 8 mTorr |
| Bias Power |  | 100 W | Bias Power |  | 100 W |
| Source Power |  | 310 W. | Source Power |  | 310 W. |
| By endpoint | | | Timed/adjustable to target LW | | |

| C. POLY ETCH | | | | | | | | |
|---|---|---|---|---|---|---|---|---|
| Poly Chamber | | | | | | | | |
| Breakthrough | | Main etch 1 | | Main etch 2 | | Overetch. | | |
| Gases: $CF_4$ | 50 cc | $Cl_2$ | 68 cc | $Cl_2$ | 76 cc | HBr | 160 cc |
|  |  | HBr | 112 cc | HBr | 161 cc | $He/O_2$ | 10 cc |
|  |  | $He/O_2$ | 16 cc | $He/O_2$ | 18 cc |  |  |
| Pressure | 4 mTorr |  | 4 mTorr |  | 13 mTorr |  | 100 mTorr |
| Bias | 40 W |  | 80 W |  | 55 W |  | 150 W |
| Source | 500 W |  | 475 W |  | 335 W. |  | 1000 W |
| By Time |  | By time |  | To endpoint |  | By time |  |

This process is performed in an Applied Materials Decoupled Plasma (DPS) etch chamber. The BARC etch is processed first, the BARC is cleared to endpoint, then the overetch is used to shrink the resist/BARC linewidth, with the overetch time/percentage determined by the amount of linewidth reduction desired. Then, the gate polysilicon is etched. The first polysilicon etch step is a breakthrough step to remove any residuals and any native oxides on the surface of the polysilicon. The second step is a timed etch to clear approximately 80% of the polysilicon. The third step is an endpointed etch and is run until poly clear is seen. The fourth step, the overetch, is used to remove any remaining polysilicon filaments.

Figure 7:
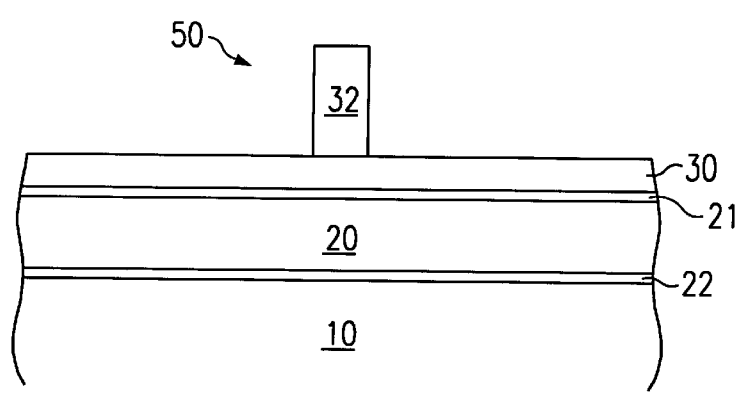
FIG. 7 is a cross-sectional diagram of an alternative embodiment of the invention.

In another embodiment of the invention, a $SiO_xN_y$ layer (or other dielectric anti-reflective coating) is used for BARC 30. In this embodiment, the BARC layer can be significantly thinner. For example, it can be on the order of 300 Å. After the formation of the BARC 30 and resist, the resist 32 is patterned as in the first embodiment. Then, instead of etching BARC layer 30, the resist 32 is overetched for line width reduction, as shown in FIG. 7, using the same etch chemistry described above. BARC layer 30 is then etched using the reduced width resist pattern. Chemistries for etching the BARC layer are known in the art. For example, $CF_4$ or $CHF_3$ may be used. Finally, the polysilicon layer 20 is etched.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a polysilicon line, comprising the steps of:
    depositing a layer of polysilicon;
    depositing a layer of bottom anti-reflective coating (BARC) over the polysilicon layer;
    depositing a layer of resist over said BARC layer;
    removing portions of said resist layer to create a resist pattern having a first width;
    etching said BARC layer using said resist pattern until an endpoint is detected with an etch chemistry comprising HBr and oxygen;
    overetching said BARC layer and said resist pattern using a timed etch and said etch chemistry to create a reduced width pattern having a second width smaller than said first width;
    etching said polysilicon layer using said reduced width pattern to create said polysilicon line.

2. The method of claim 1, wherein said BARC layer has a thickness in the range of 1200–1600 Å.

3. The method of claim 1, wherein said reduced width pattern has a width less than 0.23 µm.

4. The method of claim 1, wherein said reduced width pattern has a width in the range of 0.08 to 0.15 µm.

5. The method of claim 1, wherein said second width is less than the first width by an amount on the order of 1 µm or less.

6. The method of claim 1, wherein said BARC layer has a thickness on the order of 1200 Å and said resist layer has a thickness on the order of 7700 Å.

7. The method of claim 1, wherein said overetching step has a duration in the range of 50% to 70% of a time of said etching said BARC layer step.

8. The method of claim 1, wherein said overetching step has an etch selectivity between the BARC and resist of approximately 1:1.

9. A method of fabricating an integrated circuit, comprising the steps of:
    depositing a layer of polysilicon;
    depositing a layer of bottom anti-reflective coating (BARC) over the polysilicon layer;
    depositing a layer of resist over said BARC layer;
    removing portions of said resist layer to create a resist pattern using a lithographic tool;
    etching said BARC layer with an etch chemistry comprising $HBr/O_2$ using said resist pattern until an endpoint is detected and then continuing the etch for a selected time to overetch said BARC layer and said resist pattern, wherein said overetch has a selectivity between the BARC layer and the resist pattern of approximately one to one such that a reduced width pattern having a width less than 0.20 µm is created;
    etching said polysilicon layer using said reduced width pattern to create a polysilicon line.

10. The method of claim 9, wherein said BARC layer has a thickness in the range of 1200–1600 Å.

11. The method of claim 9, wherein said reduced width pattern has a width in the range of 0.11 to 0.20 µm.

12. The method of claim 9, wherein said reduced width pattern has a width less than the width of said resist pattern by an amount on the order of 0.1 µm or less.

13. The method of claim 9, wherein said BARC layer has a thickness on the order of 1200 Å and said resist layer has a thickness on the order of 7700 Å.

14. The method of claim 9, wherein said etching step continues after said endpoint for an overetch having a duration in the range of 50% to 70% of a time of the etch to endpoint.

* * * * *